(12) United States Patent
Zhuang et al.

(10) Patent No.: US 7,759,235 B2
(45) Date of Patent: Jul. 20, 2010

(54) SEMICONDUCTOR DEVICE MANUFACTURING METHODS

(75) Inventors: Haoren Zhuang, Hopewell Junction, NY (US); Helen Wang, LaGrangeville, NY (US); Len Yuan Tsou, New City, NY (US); Scott D. Halle, Hopewell Junction, NY (US)

(73) Assignees: Infineon Technologies AG, Neubiberg (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/810,810

(22) Filed: Jun. 7, 2007

(65) Prior Publication Data

US 2008/0305623 A1 Dec. 11, 2008

(51) Int. Cl.
*H01L 21/3205* (2006.01)
(52) U.S. Cl. .................... 438/587; 257/E21.661
(58) Field of Classification Search ..................
257/E27.098–E27.101, E27.077, E21.661
See application file for complete search history.

(56) References Cited

U.S. PATENT DOCUMENTS

| 6,743,711 | B2 | 6/2004 | Kim |
| 6,767,825 | B1 | 7/2004 | Wu |
| 6,787,469 | B2 | 9/2004 | Houston et al. |
| 2002/0074593 | A1* | 6/2002 | Ohbayashi .................. 257/315 |
| 2004/0170906 | A1* | 9/2004 | Chen et al. ..................... 430/5 |
| 2008/0286698 | A1 | 11/2008 | Zhuang et al. |

OTHER PUBLICATIONS

Zhuang, H., et al., "Patterning Strategies for Gate Level Tip-Tip Distance Reduction in SRAM Cell for 45nm and Beyond," International Semiconductor Technology Conference (ISTC) 2007, Mar. 18-20, 2007, 2 pp., Electrochemical Society, Inc., Shanghai, China.

* cited by examiner

*Primary Examiner*—Kimberly D Nguyen
*Assistant Examiner*—Tony Tran
(74) *Attorney, Agent, or Firm*—Slater & Matsil, L.L.P.

(57) ABSTRACT

Methods for manufacturing semiconductor devices are disclosed. In a preferred embodiment, a method of processing a semiconductor device includes providing a workpiece, the workpiece comprising a material layer to be patterned disposed thereon. A hard mask is formed over the material layer. A first pattern is formed in the hard mask and an upper portion of the material layer using a first etch process. A second pattern is formed in the hard mask and the upper portion of the material layer using a second etch process, the second pattern being different than the first pattern. The first pattern and the second pattern are formed in a lower portion of the material layer using a third etch process and using the hard mask as a mask.

27 Claims, 9 Drawing Sheets

SEMICONDUCTOR DEVICE MANUFACTURING METHODS

TECHNICAL FIELD

The present invention relates generally to the fabrication of semiconductor devices, and more particularly to the fabrication of transistor gates and other features of semiconductor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET). A transistor typically includes a gate dielectric disposed over a channel region, and a gate formed over the gate dielectric. A source region and a drain region are formed on either side of the channel region within a substrate or workpiece.

A complementary metal oxide semiconductor (CMOS) device is a device that utilizes p channel metal oxide semiconductor (PMOS) field effect transistors (FETs) and n channel metal oxide semiconductor (PMOS) field effect transistors (FETs) in a complementary arrangement. One example of a memory device that uses both PMOS FETs and NMOS FETs is a static random access memory (SRAM) device. A typical SRAM device may include arrays of thousands of SRAM cells, with each SRAM cell having four or six transistors, for example. A commonly used SRAM cell is a six-transistor (6T) SRAM cell, which has two PMOS FETs interconnected with four NMOS FETs, as an example.

One challenge in transistor manufacturing processes is the patterning of the transistor gates. The overlap regions of transistor gates with underlying isolation regions and active regions formed in a workpiece are typically areas of concern, because it is important for the various material layers to align correctly in order for the device to operate properly.

Thus, what are needed in the art are improved methods of patterning transistor gates and other features of semiconductor devices.

SUMMARY OF THE INVENTION

These and other problems are generally solved or circumvented, and technical advantages are generally achieved, by preferred embodiments of the present invention, which provide novel methods of patterning transistor gates and other features of semiconductor devices.

In accordance with a preferred embodiment of the present invention, a method of processing a semiconductor device includes providing a workpiece, the workpiece comprising a material layer to be patterned disposed thereon. A hard mask is formed over the material layer. A first pattern is formed in the hard mask and an upper portion of the material layer using a first etch process. A second pattern is formed in the hard mask and the upper portion of the material layer using a second etch process, the second pattern being different than the first pattern. The first pattern and the second pattern are formed in a lower portion of the material layer using a third etch process and using the hard mask as a mask.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

Detailed Description of Illustrative Embodiments

The making and using of the presently preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to preferred embodiments in a specific context, namely in the patterning of transistor gates of SRAM devices. The invention may also be applied, however, to the patterning of other features of semiconductor devices, particularly features having a repeating pattern and comprising small sizes, e.g., reaching the resolution limits of the lithography system and processes used to pattern the device features. Embodiments of the invention may also be implemented in other semiconductor applications such as other types of memory devices, logic devices, mixed signal, and other applications, as examples.

Embodiments of the present invention provide methods for patterning features of a semiconductor device using a novel triple etch process. Two patterning steps, using two masking layers, two lithography masks, and two etch steps, are used to pattern a hard mask and to partially pattern an upper portion of a material layer. A third etch step is used to transfer the patterns to the remainder of the material layer, e.g., the lower portion of the material layer.

Figure 1:
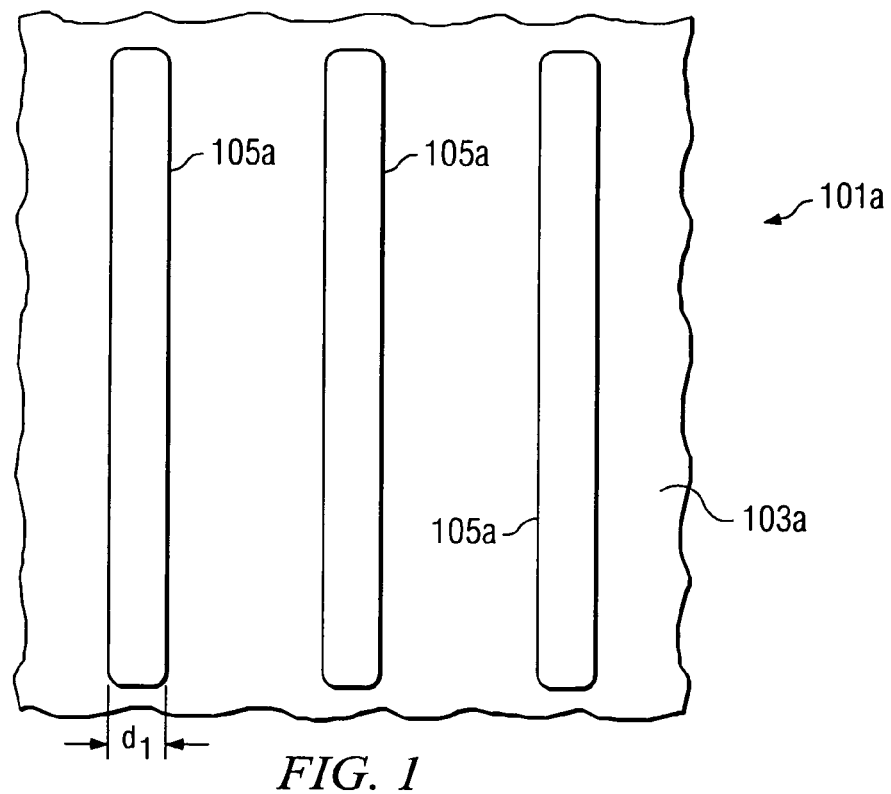
FIGS. 1 and 2 show top views of lithography masks in accordance with a preferred embodiment of the present invention, wherein one mask comprises a width-defining mask for features and the other mask comprises a length-defining mask for features.
Figure 2:
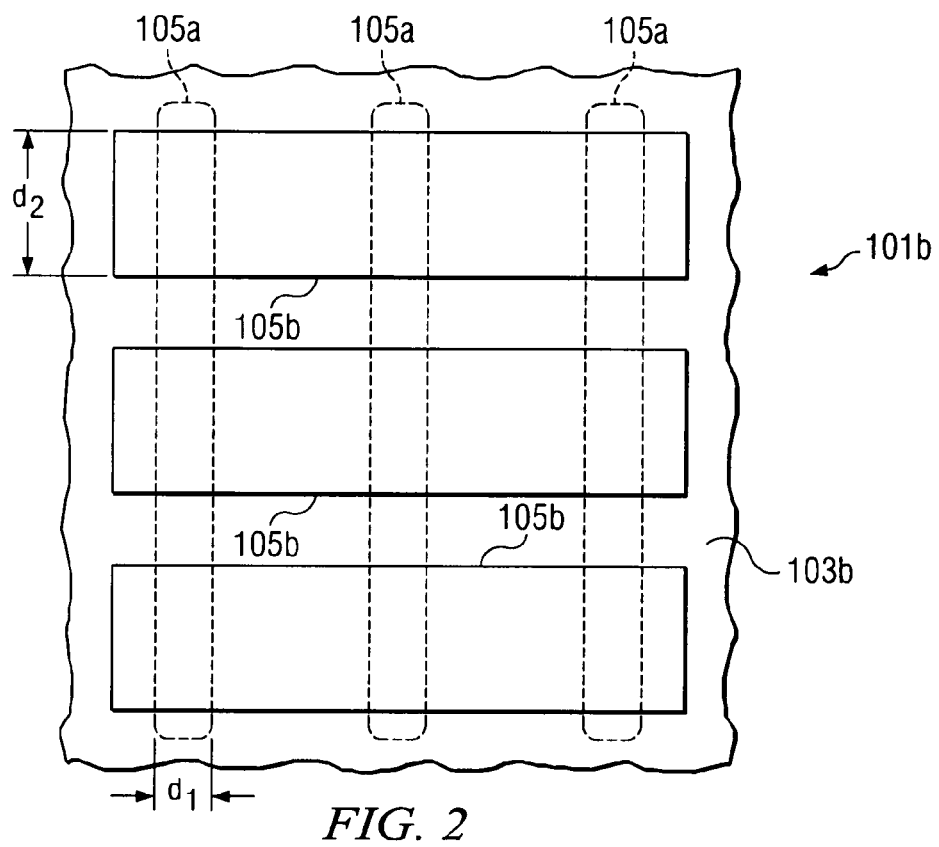

FIGS. 1 and 2 show top views of lithography masks 101a and 101b in accordance with a preferred embodiment of the present invention. The lithography mask 101a shown in FIG. 1 preferably comprises a width-defining mask. The lithography mask 101b shown in FIG. 2 preferably comprises a length-defining mask and is also referred to herein as a "cutter mask."

Referring first to FIG. 1, a lithography mask 101a in accordance with a preferred embodiment of the present invention is shown in a top view. The lithography mask 101a comprises a bright field binary mask that includes a substantially opaque material 105a attached or coupled to a substantially transparent material 103a. The substantially opaque material 105a preferably comprises a material that is opaque to light or energy, such as chromium or other opaque material. The substantially transparent material 103a preferably comprises a transparent material such as quartz or glass, although other materials may also be used. The lithography mask 101a may also comprise an alternating phase shift mask, an attenuating mask, a dark field mask, or other types of masks, as examples, not shown.

The opaque material 105a of the lithography mask 101a in accordance with a preferred embodiment of the present invention comprises a portion of a pattern for a plurality of transistor gates formed thereon. The pattern of the lithography mask 101a defines the widths of the transistors, yet does not define the lengths of the transistors, for example. The pattern of the lithography mask 101a may comprise a pattern for elongated transistor gates, for example, as shown.

The pattern preferably comprises a plurality of opaque features formed in the opaque material 105a. The patterns for the features comprised of the opaque material 105a may be arranged in a plurality of rows or columns, as shown in FIG. 1. The patterns for the features may comprise a plurality of opaque substantially rectangular shapes being elongated and having rounded ends, or the feature patterns may comprise other shapes, such as a plurality of square, round, elliptical, triangular, rectangular, polygonal, or trapezoidal features. Alternatively, the patterns for the features in the opaque material 105a may also comprise other shapes, for example.

In some embodiments, the patterns for the features preferably comprise a width (e.g., dimension $d_1$) along at least one side comprising a minimum feature size of the lithography system the manufacturing process will be used in, and the patterns for the features may be spaced apart by the same minimum feature size, as an example. The width $d_1$ and spaces may also comprise dimensions greater than the minimum feature size, alternatively. The patterns for the features may comprise a width or dimension $d_1$ of about 100 nm or less, for example, although the patterns for the features in the opaque material 105a of the mask 101a may also comprise other dimensions.

The lithography mask 101a shown in FIG. 1 is also referred to herein as a first lithography mask. The pattern in the opaque material 105a of the lithography mask 101a is also referred to herein as a first pattern or a first portion of a pattern, for example.

The patterns for features in the opaque material 105a of the lithography mask 101a may also include small protrusions or serifs along their length or at their ends for optical proximity correction (OPC) in the lithography process, for example, not shown. The OPC structures are not printed on a material layer during a lithography process, but rather, compensate at least partially for diffraction effects in the lithography process and system.

Referring next to FIG. 2, a lithography mask 101b in accordance with a preferred embodiment is shown in a top view. The lithography mask 101b comprises a bright field binary mask that includes a substantially opaque material 105b attached or coupled to a substantially transparent material 103b. The substantially opaque material 105b and the substantially transparent material 103b preferably comprise similar materials as described for the lithography mask 101a of FIG. 1. The lithography mask 101b may also comprise an alternating phase shift mask, an attenuating mask, a dark field mask, or other types of masks, as examples, not shown.

The opaque material 105b of the lithography mask 101b in accordance with a preferred embodiment of the present invention comprises a portion of a pattern for a plurality of transistor gates formed thereon. The pattern defines the lengths of the transistors, yet does not define the widths of the transistors, for example. The pattern of the lithography mask 101b may comprise a pattern adapted to "cut" or segment the patterns for elongated transistor gates of lithography mask 101a, shown in phantom, for example. Thus, the pattern of the lithography mask 101b preferably intersects the pattern of lithography mask 101a shown in FIG. 1 in accordance with embodiments of the present invention.

The pattern preferably comprises a plurality of opaque features formed in the opaque material 105b. The patterns for the features comprised of the opaque material 105b may be arranged in a plurality of columns or rows, as shown in FIG. 2. The patterns for features comprised of the opaque material 105b are preferably substantially perpendicular to the patterns for features formed in the opaque material 105a of lithography mask 101a. The patterns for the features may comprise a plurality of opaque substantially rectangular shapes being elongated and having rounded ends, or the feature patterns may comprise other shapes, such as a plurality of square, round, elliptical, triangular, rectangular, polygonal, or trapezoidal features. Alternatively, the patterns for the features in the opaque material 105b may also comprise other shapes, for example.

In some embodiments, the patterns for the features of the mask 101b preferably comprise a length (e.g., dimension $d_2$) along at least one side. The patterns for the features may be spaced apart by a minimum feature size, as an example, such as dimension $d_1$ shown in FIG. 1. Alternatively, the patterns for the features may be spaced apart by dimensions greater than the minimum features size. The patterns for the features may comprise a length or dimension $d_2$ of about 500 nm or less, and spacing between them, or a tip-to-tip distance, of about 150 nm or less in some applications, as examples, although the patterns for the features in the opaque material 105b of the mask 101b may also comprise other dimensions.

The lithography mask 101b shown in FIG. 2 is also referred to herein as a second lithography mask. The pattern in the opaque material 105b of the lithography mask 101b of the second lithography mask 101b is also referred to herein as a second pattern or a second portion of a pattern, for example.

The patterns for features in the opaque material 105b of the lithography mask 101b may also include small protrusions or serifs along their length or at their ends, for optical proximity correction (OPC) in the lithography process, for example, not shown. The OPC structures are not printed on a material layer during a lithography process, but rather, compensate at least partially for diffraction effects in the lithography process and system.

The patterns in the lithography masks 101a and 101b preferably comprise positive patterns in some embodiments, for example, wherein the patterns in the opaque material 105a and 105b, respectively, represent regions where material on a semiconductor device will remain residing after a two-step etch process. For example, preferably material will remain residing at the intersection of the patterns in the two opaque materials 101a and 101b. Alternatively, the patterns may comprise negative patterns (not shown).

Figure 3:
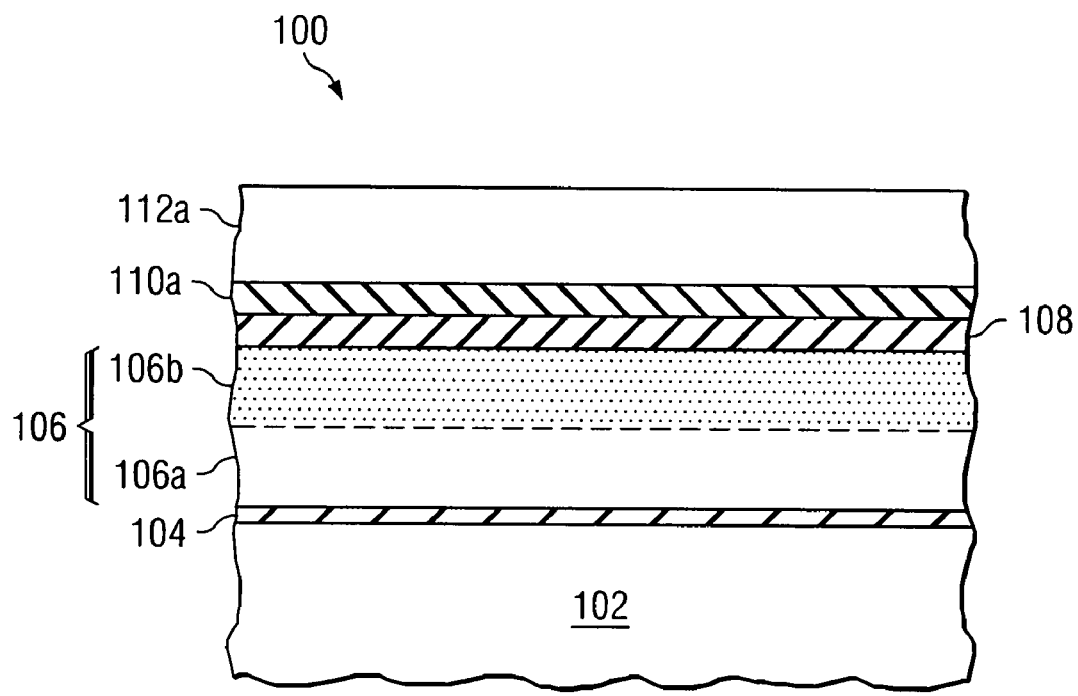
FIGS. 3 through 5 show cross-sectional views of a semiconductor device at various stages of manufacturing in accordance with a preferred embodiment of the present invention, wherein the lithography mask shown in FIG. 1 is used to pattern a hard mask and an upper portion of a material layer with a first pattern.
Figure 4:
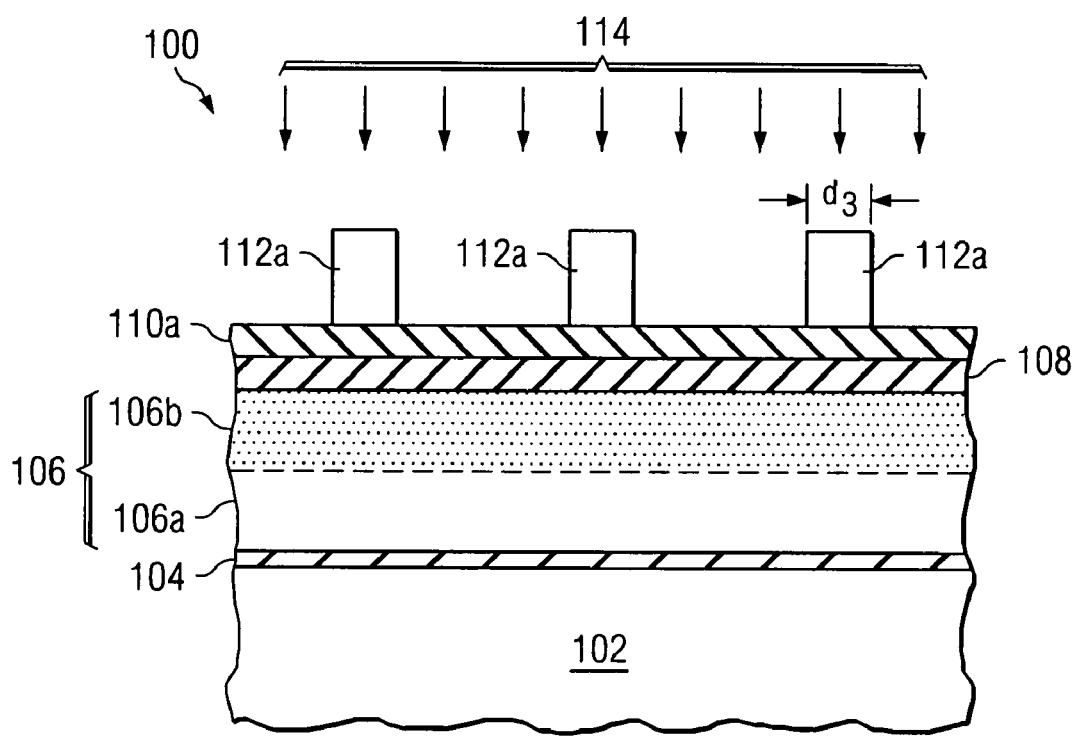
Figure 5:
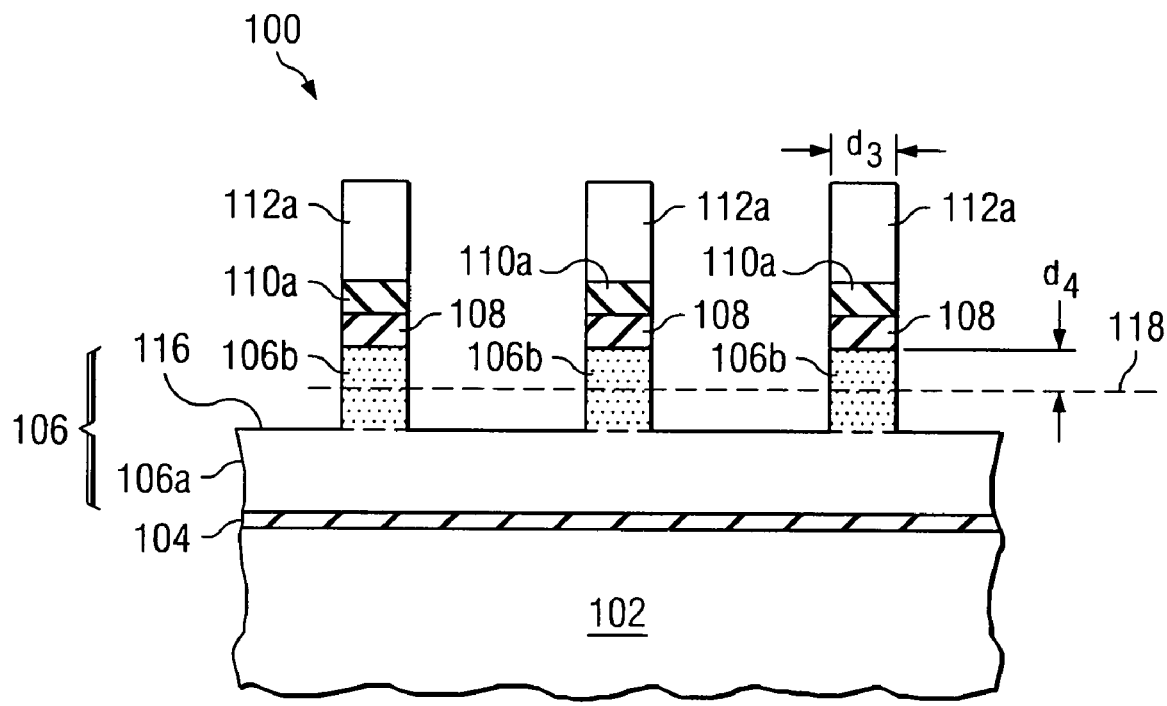

FIGS. 3 through 5 show cross-sectional views of a semiconductor device 100 at various stages of manufacturing in accordance with a preferred embodiment of the present invention, wherein the lithography mask 101a shown in FIG. 1 is used to pattern a hard mask 108 and an upper portion 106b of a material layer 106 with the first pattern of the first lithography mask 101a. To manufacture a semiconductor device 100 using the mask 101a of FIG. 1, first, a workpiece 102 is provided, as shown in FIG. 3. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) substrate, for example.

A gate dielectric material 104 may be disposed over the workpiece 102, as shown. The gate dielectric material 104 may comprise an insulating material such as silicon dioxide, silicon nitride, a high dielectric constant (k) material, or combinations or multiple layers thereof, as examples. Alternatively, the gate dielectric material 104 may comprise other materials. The gate dielectric material 104 may comprise a thickness of about 300 Angstroms or less, for example, although alternatively, the gate dielectric material 104 may comprise other dimensions. The gate dielectric material 104 may be optional in some semiconductor device designs, e.g., when the manufacturing method is used to pattern devices other than transistors or memory devices.

A material layer 106 to be patterned such as a gate material 106 is disposed over the gate dielectric material 104, or the material layer is disposed directly over the workpiece 102 if a gate dielectric material 104 is not included. The gate material 106 may comprise a semiconductive material such as polysilicon or a conductor such as a metal, or combinations or multiple layers thereof, as examples. Alternatively, the gate material 106 may comprise other materials. The gate material 106 may comprise a thickness of about 1,500 Angstroms or less, for example, although alternatively, the gate material 106 may comprise other dimensions. Alternatively, the material layer 106 to be patterned may comprise a conductive material, a semiconductive material, an insulator, or multiple layers or combinations thereof, as examples.

The material layer 106 preferably comprises an upper portion 106b and a lower portion 106a disposed beneath the upper portion 106b, as shown. In embodiments where the material layer 106 to be patterned comprises a gate material 106, preferably, in some embodiments, a dopant material is introduced into the upper portion 106b of the material layer 106. The dopant material may be implanted by ion implantation after the gate material 106 is deposited, or the gate material 106 may be doped using in-situ doping during the deposition process of the upper portion 106b of the gate material 106, as examples, although other doping methods may also be used. The dopant may be introduced after the lower portion of the material layer 106a is formed, during the deposition process for the upper portion 106b of the material layer 106, for example. The dopant material may comprise a p or n type dopant, such as B, As, or P, as examples, although other dopant materials may also be used.

The gate material 106 may comprise an upper portion 106b comprising doped polysilicon and a lower portion 106a comprising undoped polysilicon, for example. The upper portion 106b may comprise about 700 Angstroms or less of polysilicon doped with B, As, or P, and the lower portion 106a may comprise about 700 Angstroms or more of undoped polysilicon, as examples, although alternatively, the gate material 106 may comprise other materials and dimensions. The upper portion 106b preferably comprises about the top half of the gate material 106 thickness in some embodiments, for example.

In some embodiments, for example, the upper portion 106b comprises a material that is different than the lower portion 106a of the material layer 106. A material layer 106 comprising different materials for the upper portion 106b and the lower portion 106a may be advantageous because some etch selectivity between the upper portion 106b and the lower portion 106a may be provided, for example. However, in other embodiments, the upper portion 106b may comprise the same material as the lower portion 106a of the material layer 106.

A hard mask 108 is formed over the material layer 106 to be patterned, e.g., over the gate material 106, as shown. The hard mask 108 preferably comprises a nitride material layer, an oxide material layer, or combinations or multiple layers thereof, as examples, although other materials may also be used. The hard mask 108 preferably comprises a thickness of about 500 Angstroms or less, for example, although alternatively, the hard mask 108 may comprise other dimensions.

The hard mask 108 in some embodiments of the present invention preferably comprises a first layer of silicon dioxide having a thickness of about 50 Angstroms or less, and a second layer of silicon nitride having a thickness of about 450 Angstroms or less, as an example. The hard mask 108 material preferably comprises a material with a high etch selectivity to the material of the material layer 106 to be patterned, for example. In some embodiments, the hard mask 108 preferably comprises a nitride material layer that is used as a mask for a later etch process, or as a stress-increasing or stress-reducing material layer for underlying regions of the semiconductor device 100, as examples.

The first pattern of the first lithography mask 101a shown in FIG. 1 is formed in the hard mask 108 and in the upper portion of the material layer 106 using a first etch process 114, as shown in FIGS. 3 through 6. To pattern the hard mask 108, a first masking material 110a/112a is formed over the hard mask 108, as shown in FIG. 3. The first masking material 110a/112a preferably comprises a first anti-reflective coating 110a disposed over the hard mask 108, and a first layer of photosensitive material 112a such as a photoresist disposed over the anti-reflective coating 110a. The first anti-reflective coating 110a may comprise an organic material or an organic material comprising silicon, for example, although other materials may also be used. An optional optically dense layer (ODL) (not shown) comprising an organic material that may be optically reflective, for example, may be disposed beneath the anti-reflective coating 110a, if a tri-layer resist is used, for example.

The first masking material 110a/112a is patterned with the first pattern of the first lithography mask 101a shown in FIG. 1 using the first lithography mask 101a. The first pattern, also referred to herein as a first portion of a pattern, comprises substantially the same shape as the pattern in the opaque material 105a of the first lithography mask 101a (e.g., before optional OPC structures, not shown, are added to the mask 101a), for example. The first pattern preferably comprises a dimension $d_3$ defined by the first pattern of the first lithography mask 101a, wherein the dimension $d_3$ is defined by and is substantially the same as dimension $d_1$ of the opaque features 105a of the first lithography mask 101a, if a 1:1 lithography system is used, for example. Alternatively, the lithography system may comprise a reduction factor, such as 4:1, as an example, although other reduction factors may also be used. The first layer of photoresist 112a may be patterned with the first pattern, and the first layer of photoresist 112a may be used as a mask to open the first anti-reflective coating 110a, for example.

The first pattern formed in the first masking material 110a/112a defines the width of gates formed in the gate material 106 when the first pattern is transferred to the gate material 106 in later processing steps. Note that the smaller side of gates such as gates 106 described herein are often referred to in the art as a "gate length." However, for purposes of discussion, the smaller side of the gates 106 are referred to herein as a width, and the longer side of the gates 106 formed in the material layer 106 are referred to herein as a length.

The masking material 110a/112a is exposed to light or energy through or reflected from the first lithography mask 101a to expose portions of the layer of photoresist 112a not protected by the mask 101a, leaving portions of the layer of photoresist 112a unexposed. The layer of photoresist 112a is then developed, forming the first pattern or the first portion of the pattern in the layer of photoresist 112a. Exposed portions of the layer of photoresist 112a are then etched or stripped away, as shown in FIG. 4.

The first pattern of the first masking material 110a/112a is transferred to the anti-reflective coating 110a, the hard mask 108 and the upper portion of the material layer 106 using a first etch process 114, as shown in FIGS. 4 and 5. The first layer of photoresist 112a is used as a mask to open, pattern, or etch away portions of the optional ODL (not shown) and the anti-reflective coating 110a, and to pattern the hard mask 108 and at least a portion of the upper portion 106b of the material layer 106 using the first etch process 114, as shown in FIG. 4. After the first etch process 114, at least a portion of the upper portion 106b of the material layer 106 and the hard mask 108 comprise the first pattern comprising dimension $d_3$, as shown in FIG. 5.

The first etch process 114 may comprise different chemistries used to open the ODL (not shown) and the anti-reflective coating than are used to pattern the hard mask 108 and the upper portion 106b of the material layer 106, for example. The first etch process 114 may also comprise different etch chemistries to etch the hard mask 108 and the material layer 106; for example, the first etch process 114 may comprise a two-step etch process comprising a first end-point-detecting etch process for etching the hard mask 108 and a second timed etch for etching at least the portion of the upper portion 106b of the gate material 106. If the hard mask 108 comprises a nitride material, for example, an end point detector may be used to detect when the hard mask 108 has been completely etched through, at which time the etch process may be timed to achieve the desired depth within the upper portion 106b of the gate material 106, in some embodiments.

The first etch process 114 used to pattern the hard mask 108 and the upper portion 106b of the material layer 106 preferably comprises a relatively aggressive etch process, comprising an etch chemistry such as a $CF_4$-based etch chemistry, as an example. The first etch process 114 is preferably performed at relatively high temperatures, such as at about 60 degrees C. or greater, as an example. Alternatively, other etch chemistries and temperatures may also be used for the first etch process 114, for example.

Figure 6:
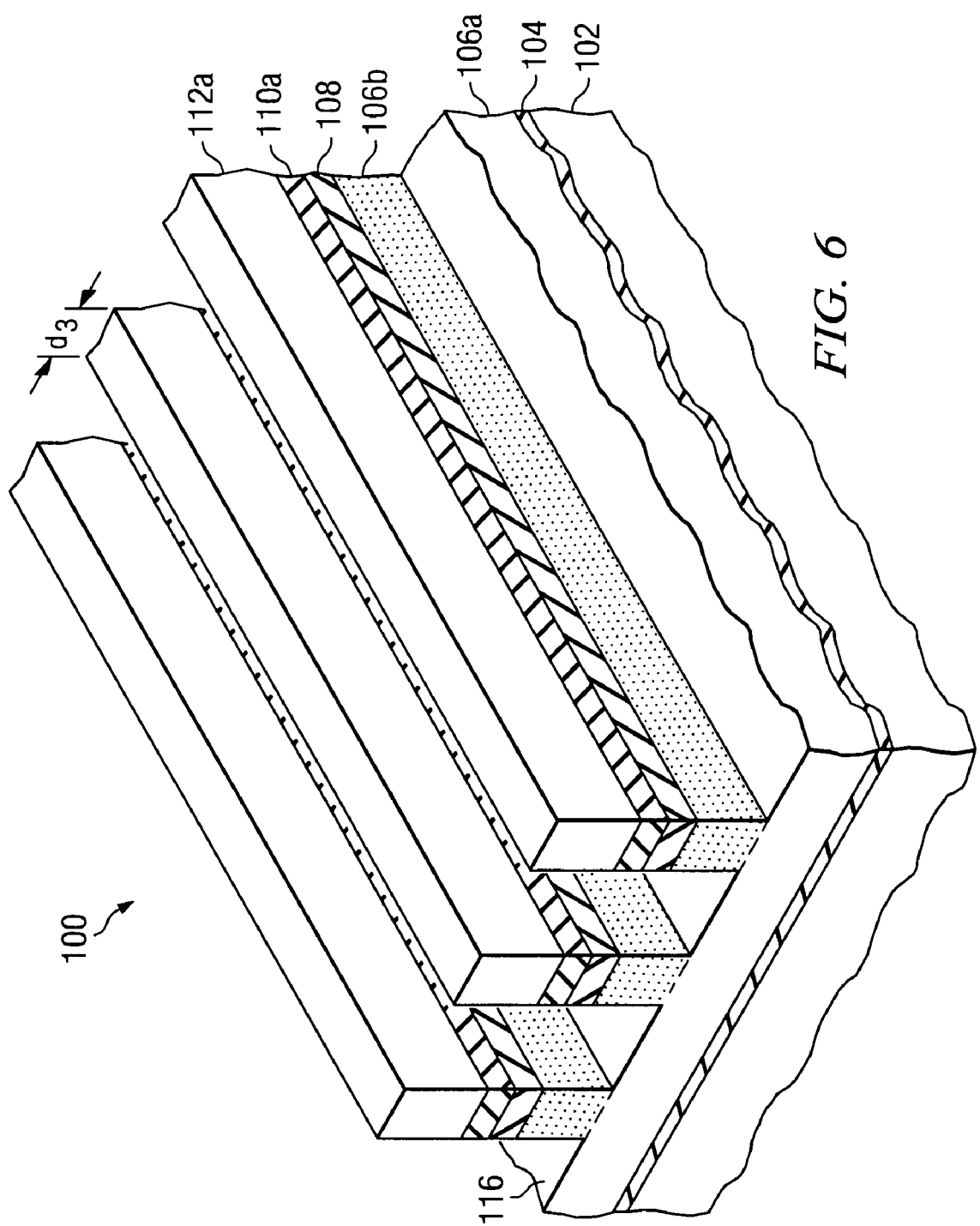
FIG. 6 shows a perspective view of the semiconductor device shown in FIG. 5.

In some embodiments, the first pattern of the first lithography mask 101a is preferably formed in the entire thickness of the upper portion 106b of the gate material 106, as shown in a cross-sectional view in FIG. 5 and in a perspective view in FIG. 6. In these embodiments, the first etch process 114 is continued until the top surface 116 of the lower portion 106a of the gate material 106 is reached and/or exposed. Alternatively, in other embodiments, the first pattern is preferably formed in an upper about 30 to 70% of the upper portion 106b of the gate material 106, as shown in phantom in FIG. 5, until a predetermined level 118 within the upper portion 106b of the gate material 106 is reached. The dimension $d_4$ of the upper region that is etched or patterned extending beneath a top surface of the upper portion 106b preferably comprises about 30 to 70% below the top surface of the upper portion 106b of the material layer 106, for example.

Note that a portion of or the entire layer of photoresist 112a may be consumed or removed during the first etch process 114 to pattern the hard mask 108 and material layer 106 with the first pattern, not shown. The first masking material 110a/112a, e.g., any remaining photoresist 112a, the ODL, if present, and the anti-reflective coating 110a are then removed from over the workpiece 102.

Figure 7:
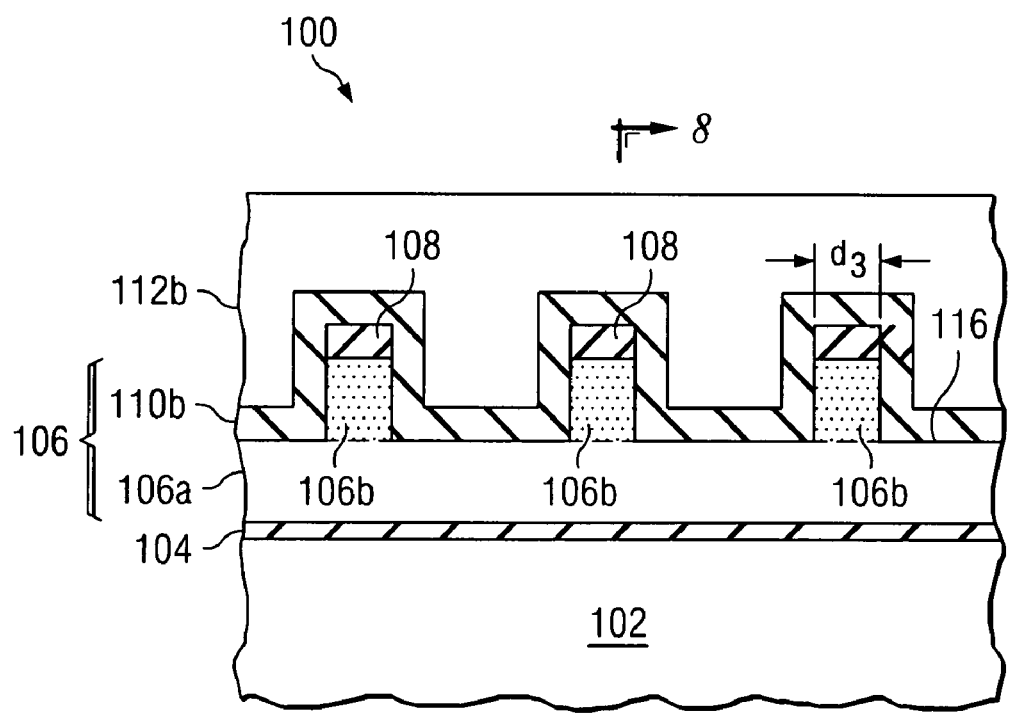
FIGS. 7 through 9 show cross-sectional views of a semiconductor device at various stages of manufacturing, wherein the lithography mask shown in FIG. 2 is used to pattern the hard mask and the upper portion of the material layer shown in the previous figures with a second pattern.

Next, the second pattern of the second lithography mask 101b shown in FIG. 2 is formed in the hard mask 108 and in the upper portion 106b of the material layer 106, using a second etch process 120, as shown in FIGS. 7 through 10. To pattern the hard mask 108 with the second pattern, a second masking material 110b/112b is formed over the hard mask 108, over sidewalls of the hard mask and upper portion of the material layer 106b, and over exposed portions of the lower portion of the material layer 106a, as shown in FIG. 7. The second masking material 110b/112b may comprise similar materials as described for the first masking material 110a/112a, for example. The second masking material 110b/112b preferably comprises a second anti-reflective coating 110b disposed over the hard mask 108, and a second layer of photosensitive material 112b such as a photoresist disposed over the second anti-reflective coating 110b. An optional second ODL may be disposed beneath the second anti-reflective coating 110b and the second layer of photosensitive material 112b if a tri-layer resist is used as the second masking material 110b/112b, for example, not shown. The anti-reflective coating 110b may include silicon in this embodiment, for example.

Figure 8:
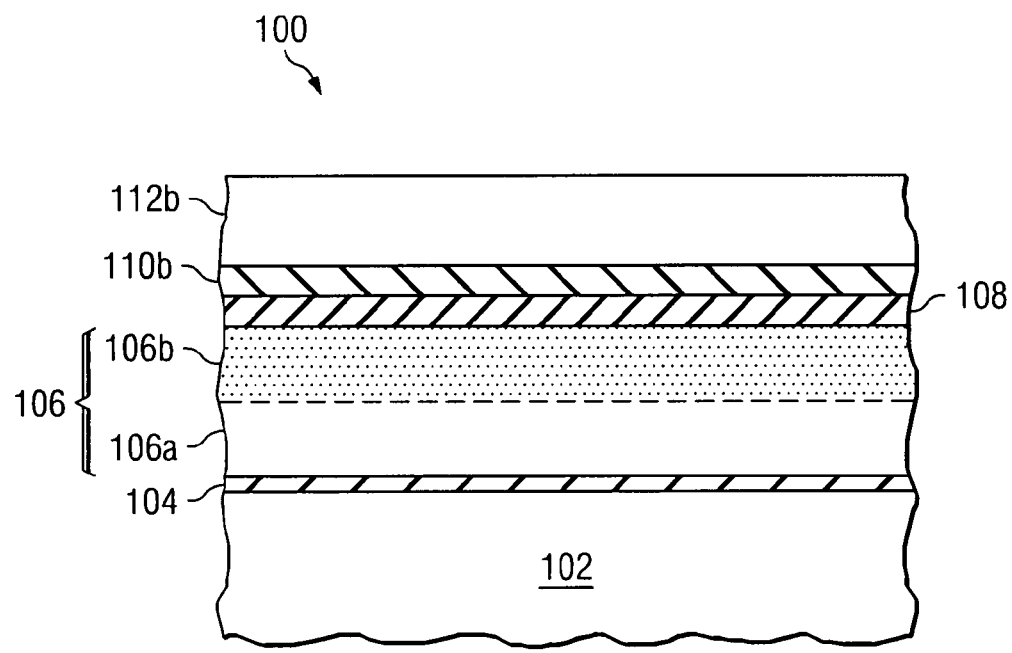

FIG. 8 shows a cross-sectional view of the semiconductor device 100 of FIG. 7 rotated by ninety degrees. FIG. 8 illustrates a cross-sectional view of a semiconductor device 100 at "8-8" in FIG. 7, for example. The masking material 110b/112b is patterned with the second pattern of the second lithography mask 101b shown in FIG. 2 using the second lithography mask 101b. The second pattern formed in the second masking material 110b/112b defines the length, e.g., the longer side, of gates formed in the gate material 106.

The second pattern is preferably different than the first pattern. The second pattern, also referred to herein as a second portion of a pattern, comprises substantially the same shape (e.g., reduced by the reduction factor of the lithography system) as the pattern in the opaque material 105b of the second lithography mask 101b (e.g., before optional OPC structures, not shown, are added to the mask 101a), for example. The second pattern preferably comprises a dimension $d_5$ defined by the second pattern of the lithography mask 101b, wherein the dimension $d_5$ is defined by and is substantially the same as dimension $d_2$ of the opaque features 105b of the second lithography mask 101b, reduced by the reduction factor, for example. The masking material 110b/112b is exposed to light or energy through or reflected from the second lithography mask 101b to expose portions of the second layer of photoresist 112b not protected by the second lithography mask 101b, leaving portions of the second layer of photoresist 112b unexposed. The second layer of photoresist 112b is then developed, forming the second pattern or the second portion of the pattern in the second layer of photoresist 112b. Exposed portions of the second layer of photoresist 112b are then etched or stripped away. The second layer of photoresist 112b is then used as a mask to open the second anti-reflective coating 110b.

Figure 9:
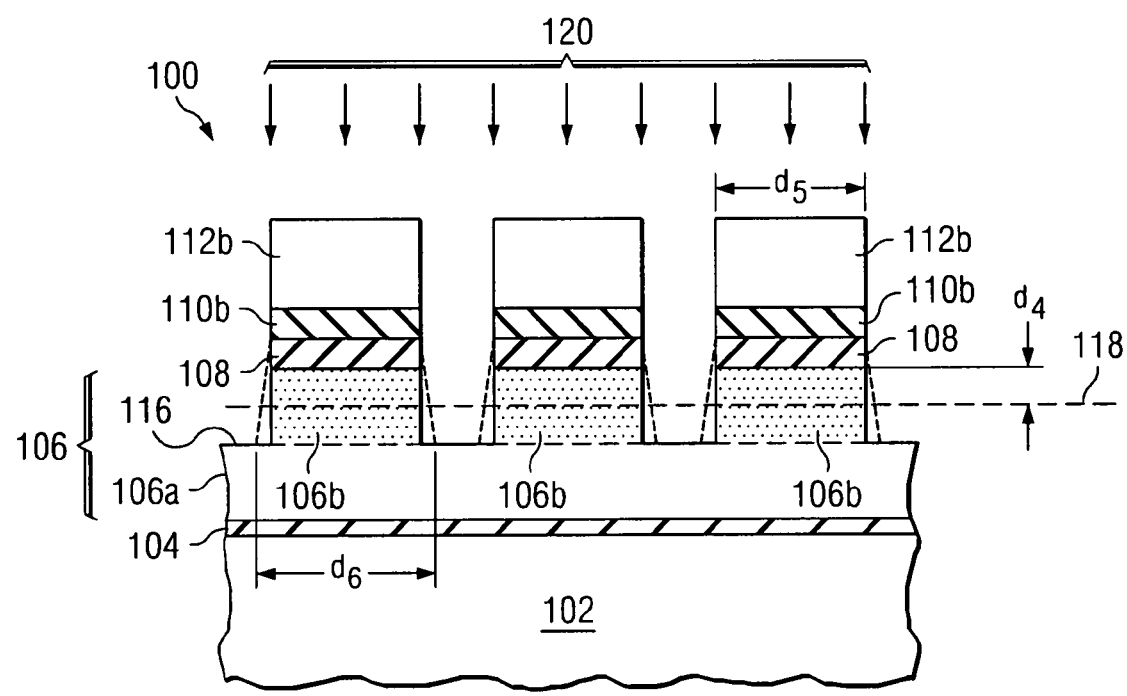

The second pattern of the second masking material 110b/112b is transferred to the hard mask 108 and the upper portion of the material layer 106 using a second etch process 120, as shown in FIG. 9, which shows the cross-sectional view of the semiconductor device 100 shown in FIG. 8 after patterning the hard mask 108 and the material layer 106 upper portion 106b, for example with the second etch process 120. The layer of photoresist 112b is used as a mask to open, pattern, or etch away portions of the optional second ODL (not shown) and the second anti-reflective coating 110b, and also to pattern the hard mask 108 and at least a portion of the upper portion 106b of the material layer 106 using the second etch process 120, as shown in FIG. 9. After the second etch process 120, at least a portion of the upper portion 106b of the material layer 106 and the hard mask 108 comprise the second pattern in the cross-section shown comprising dimension $d_5$, as shown in FIG. 9.

In some embodiments, the second etch process 120 comprises the same etch process or processes that were used for the first etch process 114 shown in FIG. 4. In other embodiments, the second etch process 120 comprises a different type of etch process than the first etch process 114, to be described further herein. The second etch process 120 may comprise different chemistries used to open the ODL (not shown) and the anti-reflective coating 110b than are used to pattern the hard mask 108 and the upper portion 106b of the material layer 106, for example. The second etch process 120 may also comprise different etch chemistries to etch the hard mask 108 and the material layer 106; for example, the second etch process 120 may comprise a two-step etch process comprising a first end-point-detecting etch process for etching the hard mask 108 and a second timed etch for etching at least the portion of the upper portion 106b of the gate material 106. If the hard mask 108 comprises a nitride material, for example, an end point detector may be used to detect when the hard mask 108 has been completely etched through, at which time the etch process may be timed to achieve the desired depth with the upper portion 106b of the gate material 106, in some embodiments.

The second etch process 120 used to pattern the hard mask 108 and the upper portion 106b of the material layer 106 preferably comprises a relatively aggressive etch process, comprising an etch chemistry such as a $CF_4$-based etch chemistry, as an example. The second etch process 120 is preferably performed at relatively high temperatures, such as about 60 degrees C. or greater, as an example. Alternatively, other etch chemistries and temperatures may also be used for the second etch process 120, for example.

Figure 10:
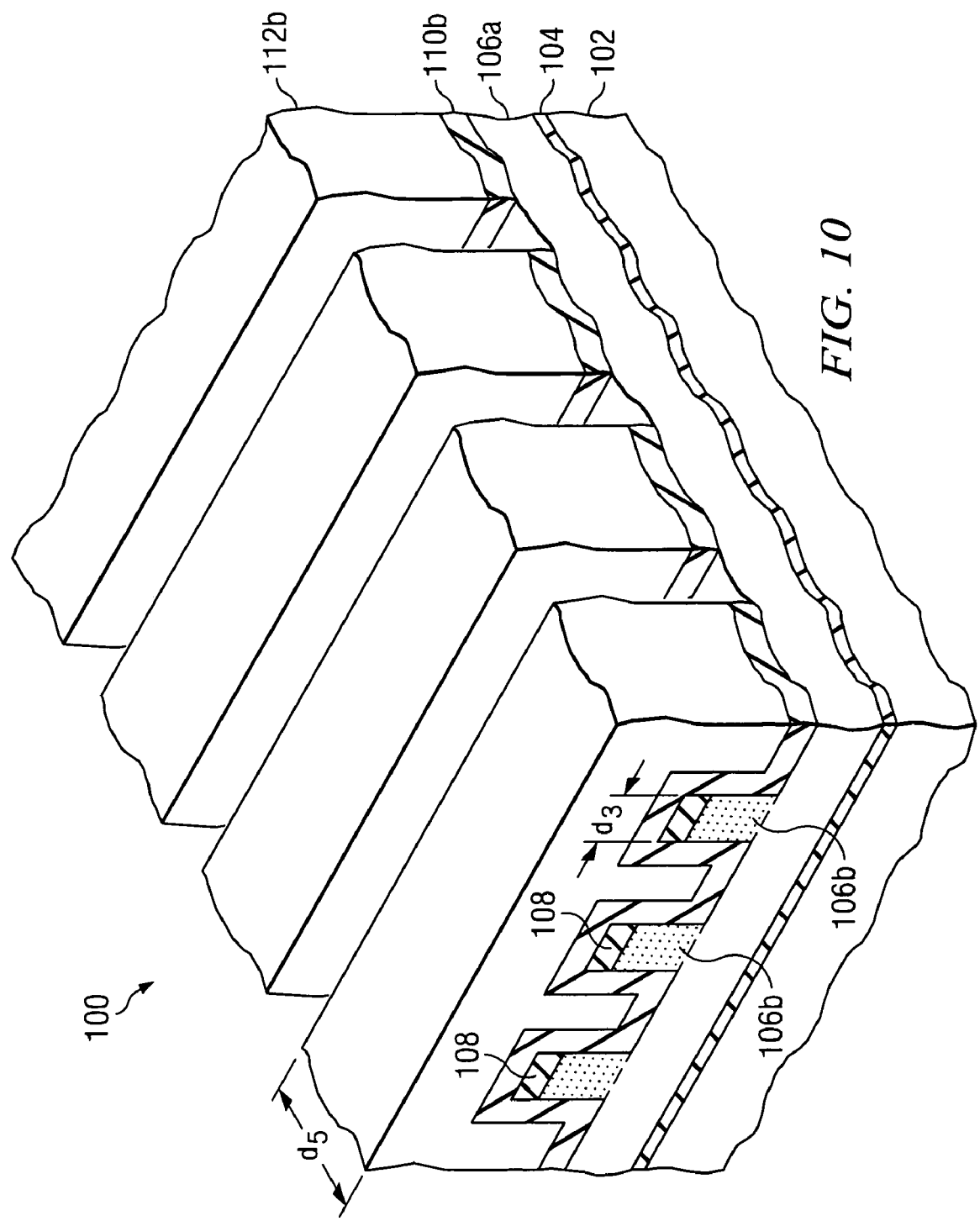
FIG. 10 shows a perspective view of the semiconductor device shown in FIG. 9.

In some embodiments, the second pattern of the second lithography mask 101b is preferably formed in the entire thickness of the upper portion 106b of the gate material 106, as shown in a cross-sectional view in FIG. 9 and in a perspective view in FIG. 10. In these embodiments, the second etch process 120 is continued until the top surface 116 of the lower portion 106a of the gate material 106 is reached. Alternatively, in other embodiments, the second pattern is preferably formed in an upper about 30 to 70% of the upper portion 106b of the gate material 106, as shown in phantom in FIG. 9, until a predetermined level 118 having dimension $d_4$ within the upper portion 106b of the gate material 106 is reached below a top surface of the upper portion 106b of the gate material 106.

A portion of or the entire layer of photoresist 112b may be consumed or removed during the second etch process 120 to pattern the hard mask 108 and material layer 106 with the second pattern, not shown. The second masking material 110b/112b, e.g., any remaining photoresist 112b, the ODL, if present, and the anti-reflective coating 110b are then removed from over the workpiece 102, leaving the structure shown in a perspective view in FIG. 11.

At this point, the hard mask 108 and at least a portion of the upper portion 106b of the material layer 106 has been patterned with the first pattern and the second pattern of the first and second lithography masks 101a and 101b, respectively. Again, the second pattern preferably comprises a different pattern than the first pattern. The second pattern preferably defines the lengths of a plurality of transistor gates or other features, represented by dimension $d_5$. The first pattern preferably defines the widths of the plurality of transistor gates or other features, represented by dimension $d_3$. The second lithography mask 101b is preferably aligned during the lithography process such that the second pattern intersects with the first pattern previously formed within the hard mask 108 and the upper portion 106b of the material layer 106.

Advantageously, the lower portion 106a of the material layer 106 has not been patterned yet at this point in the manufacturing process, so that the gate dielectric material 104 has not been exposed to the aggressive first and second etch processes 114 and 120. Thus, the lower portion 106a of the material 106 protects the gate dielectric material 104 during the aggressive first and second etch processes 114 and 120. If the lower portion 106a of the material 106 were to be etched completely away during the patterning of the upper portion 106b, then the regions of the gate dielectric material 104 where the first pattern and the second pattern intersect would be exposed to two aggressive etch processes, e.g., the first and second etch processes 114 and 120, which would increase the likelihood that the gate dielectric material 104 would be etched away or punched through, which is undesirable in some applications, for example. Thus, in accordance with the novel embodiments of the present invention, damage or punch-through to the gate dielectric material 104, or other underlying material layers in non-transistor applications, is prevented.

Figure 11:
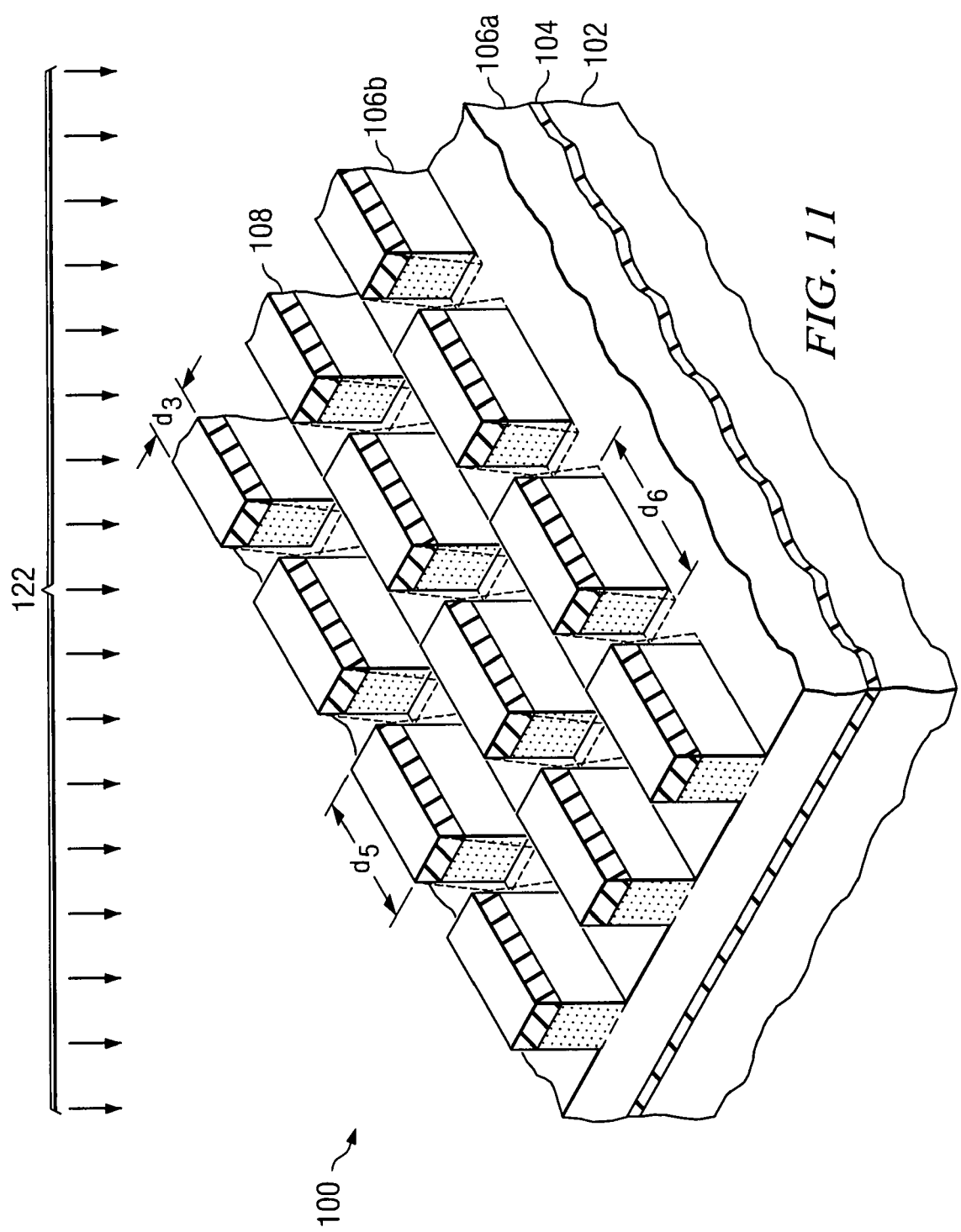
FIG. 11 shows a perspective view of the semiconductor device shown in FIG. 10 after a layer of photoresist and anti-reflective coating have been removed.
Figure 12:
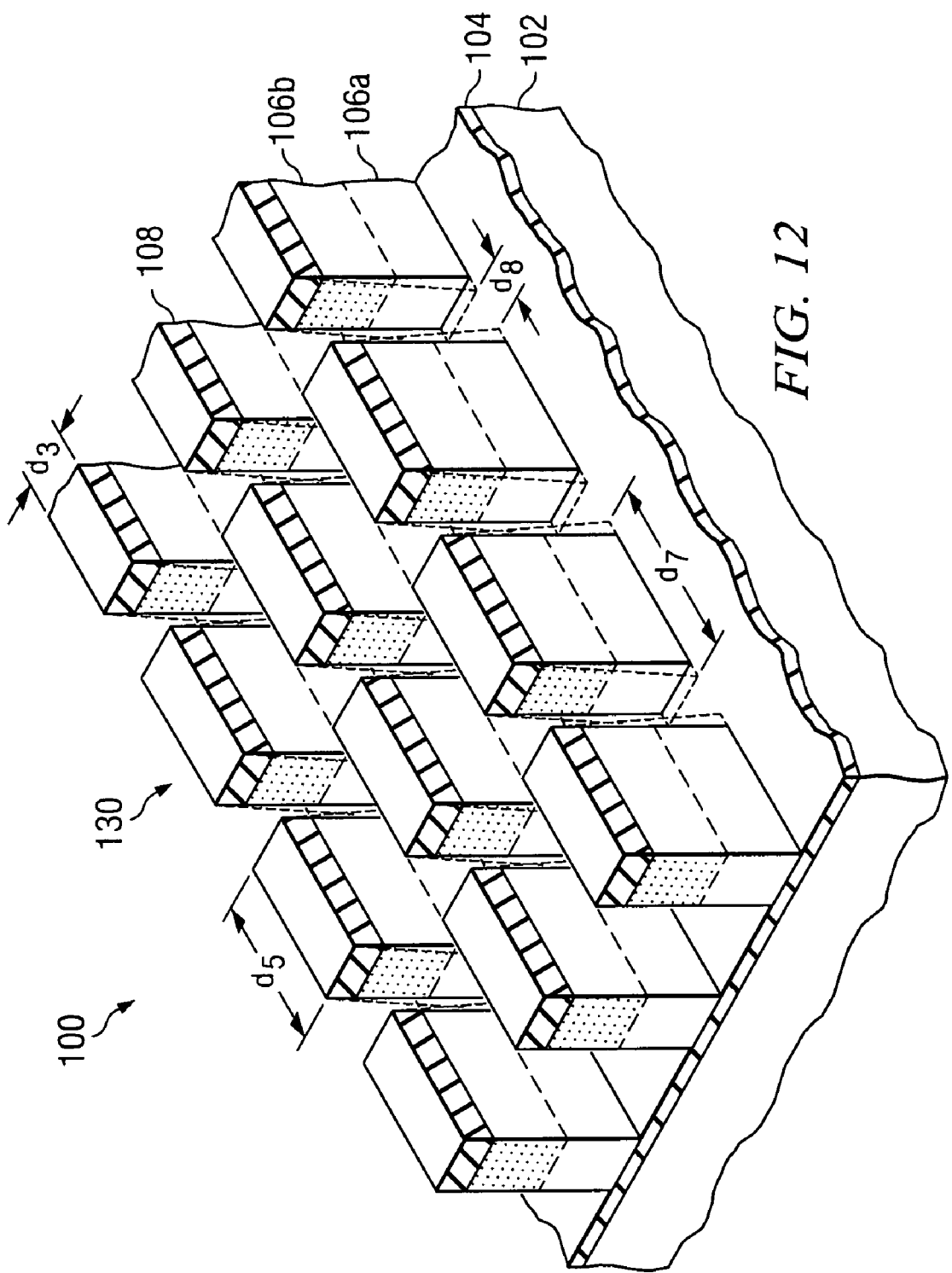
FIG. 12 shows a perspective view of the semiconductor device shown in FIG. 11 after the lower portion of the material layer has been patterned with the first pattern and the second pattern using the hard mask as a mask.

Next, the first pattern and the second pattern formed in the upper portion 106*b* of the material layer 106 and the hard mask 108 are transferred to the lower portion 106*a* of the material layer 106, as shown in FIGS. 11 and 12 in perspective views. The first pattern and the second pattern are formed in the lower portion 106*a* of the material layer 106 using a third etch process 122, using the hard mask 108 as a mask, as shown in FIG. 11. Portions of the lower portion 106*a* of the material layer 106 are removed using the hard mask 108 as a mask, forming the first pattern and the second pattern in the lower portion 106*a* of the material layer 106.

The third etch process 122 preferably comprises a different type of etch process than the first and second etch processes 114 and 120. The third etch process 122 preferably comprises a less aggressive etch process than the first and second etch processes 114 and 120 in some embodiments, for example. The third etch process 122 preferably comprises an HBr-based etch chemistry in some embodiments, although other etch chemistries may also be used for the third etch process 122. The third etch process 122 is preferably performed at a lower temperature than the first etch process 114 and/or the second etch process 120 are performed at. In some embodiments, for example, the third etch process 122 preferably comprises a temperature of about 30 to 60 degrees C., although alternatively, the third etch process 122 may be performed at other temperatures.

Note that the material layer 106 that is patterned using the methods described herein may comprise a single homogeneous layer of material (e.g., wherein the upper portion is undoped), or the material layer 106 may comprise two or more material layers.

In some embodiments, such as those described herein, preferably only the gate material 106 is patterned using the third etch process 122, leaving the underlying gate dielectric material 104 unpatterned. The gate dielectric material 104 may be patterned in a later manufacturing step in these embodiments, for example. In other embodiments, the gate dielectric material 104 may be patterned using the hard mask 108 as a mask, after the lower portion 106*a* of the material layer 106 is patterned (not shown) using the third etch process 122.

In some embodiments, the upper and lower portions 106*b* and 106*a* of the material layer 106 patterned with the first pattern and the second pattern comprise a plurality of transistor gates, for example, although a plurality of other features may also be formed in the material layer 106 using the novel methods described herein.

Figure 13:
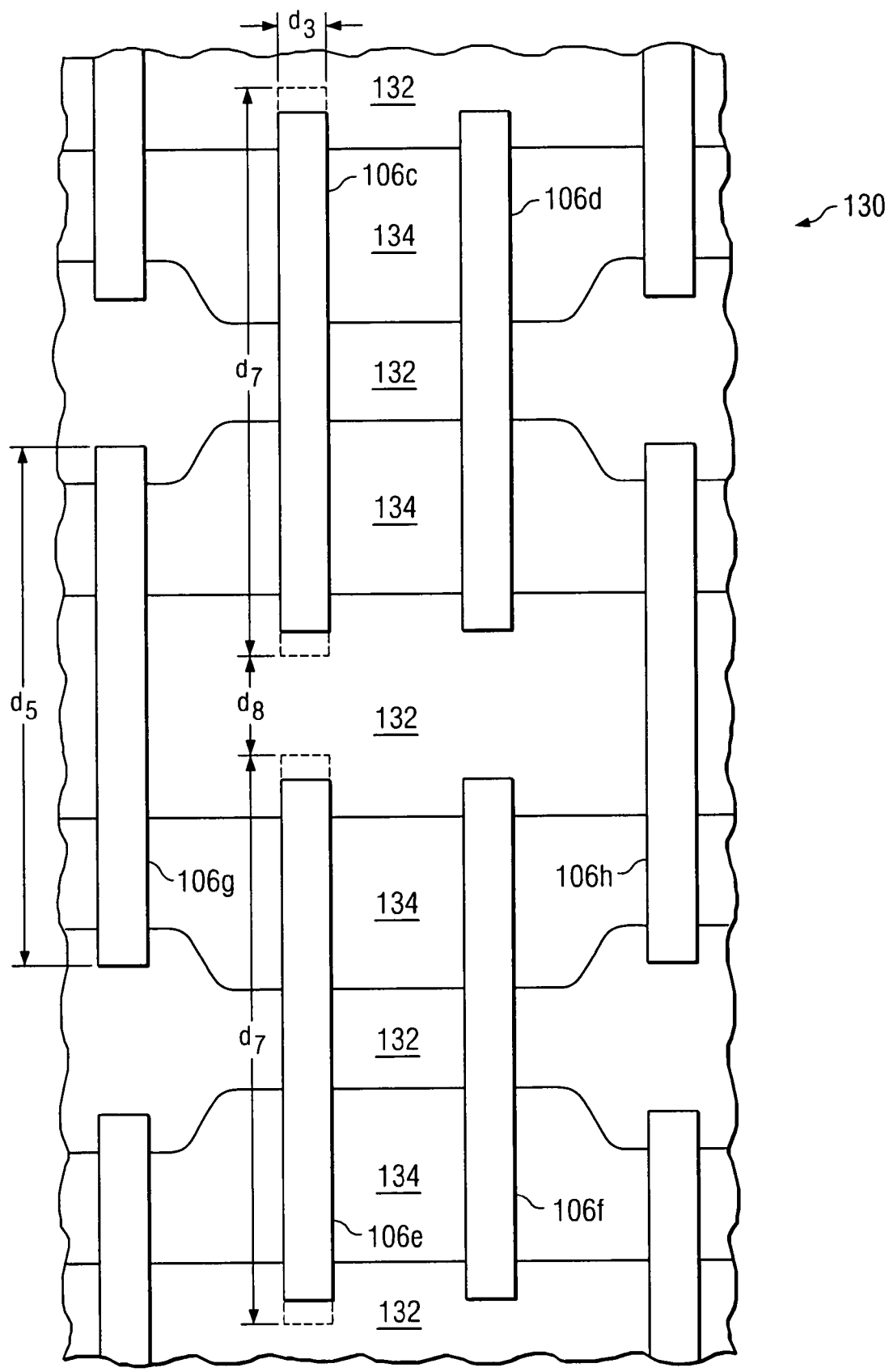
FIG. 13 shows a top view of an SRAM device that has been patterned using the novel methods of embodiments of the present invention shown in FIGS. 3 through 12.

In some embodiments, the upper and lower portions 106*b* and 106*a* of the material layer 106 patterned with the first pattern and the second pattern preferably comprise a plurality of transistor gates of an SRAM device. FIG. 13 shows a top view of an SRAM device 130 that has been patterned using the novel methods of embodiments of the present invention shown in FIG. 1 through 12, for example.

To manufacture the SRAM device 130, a workpiece 102 is provided, and a plurality of isolation regions 132 are formed in the workpiece 102. The isolation regions 132 may be formed by etching trenches in the workpiece 102 (not shown in FIG. 13; see FIGS. 3 through 12) and filling the trenches with insulating materials and liners, for example. A plurality of active areas 134 are formed in the workpiece between the plurality of isolation regions 132, as shown. The active areas 134 may be formed by implanting dopant materials into the workpiece 102 and annealing the workpiece 102, for example. Alternatively, the active areas 134 may be formed by etching holes or trenches in the workpiece 102 and forming semiconductive materials in the holes or trenches, e.g., such as by epitaxial growth or deposition. The active areas 134 may comprise source and drain regions of the transistors of the SRAM device 130, for example.

A gate dielectric material 104 is formed over the workpiece 102, isolation regions 132, and the active areas 134, and a gate material 106 is formed over the gate dielectric material 106. A hard mask 108 is formed over the gate material 106, and the hard mask 108 is patterned using the novel methods previously described with reference to FIGS. 1 through 12 herein, forming gates 106*c*, 106*d*, 106*e*, 106*f*, 106*g*, and 106*h* of the SRAM device 130.

The top view of the SRAM device 130 illustrates that the rows and columns of the transistor gate 106*c*, 106*d*, 106*e*, 106*f*, 106*g*, and 106*h* patterns may be staggered, e.g., in alternating rows or columns in pairs, as shown. Alternatively, the patterns for features formed using embodiments of the present invention may be aligned singularly or in pairs in rows and columns, for example, not shown. The features may also be arranged in other configurations, for example.

The SRAM device 130 may comprise six transistors comprising gates 106*c*, 106*d*, 106*e*, 106*f*, 106*g*, and 106*h*, for example. Gates 106*c* and 106*d* may comprise gates of NFET devices and may be n-doped, and gates 106*e*, 106*f*, 106*g*, and 106*h* may comprise gates of PFET devices and may be p-doped, for example, although alternatively, the SRAM device 130 may comprise other configurations. The SRAM device 130 shown in the top view in FIG. 13 comprises a single SRAM cell and portion of other SRAM cells; however, preferably, a plurality of SRAM cells are manufactured on a single semiconductor device 100 in accordance with preferred embodiments of the present invention.

Advantageously, because the lithography mask 101*b* shown in FIG. 2 may comprise a cutter mask that comprises a pattern that is substantially rectangular in some embodiments, the ends of the transistor gates 106*c*, 106*d*, 106*e*, 106*f*, 106*g*, and 106*h* formed in the material layer 106 may be flat or squared, which may be advantageous in some applications, for example, as shown in FIG. 13. The ends of the transistor gates 106*c*, 106*d*, 106*e*, 106*f*, 106*g*, and 106*h* formed in the material layer 106 defined by the second lithography mask 101*a* advantageously may comprise substantially flat edges, as shown, for example, in some embodiments. Thus, corner rounding of gate 106*c*, 106*d*, 106*e*, 106*f*, 106*g*, and 106*h* ends is avoided by the use of embodiments of the present invention. Improved control of the amount of overhang of the transistor gate 106*c*, 106*d*, 106*e*, 106*f*, 106*g*, and 106*h* ends, e.g., over isolation regions 132, is also provided by embodiments of the present invention.

After the embodiments of the present invention shown in FIGS. 12 and 13, further processing of the semiconductor device 100 and/or SRAM device 130 is continued to complete the fabrication process. For example, the hard mask 108 may be removed or may be left remaining in the structure. Insulating material layers may be formed over the patterned gate material 106, and contacts may be formed in the insulating layers to make contact to portions of the semiconductor devices, such as the sources, drains, and gates. Conductive material layers may be formed over the devices to provide electrical connection to the contacts and between various circuit components formed on the semiconductor devices 100, for example, not shown.

In some embodiments, three or more lithography masks may be used to pattern the hard mask 108 and the upper portion 106*b* of the material layer 106 with at least one first pattern and at least one second pattern, using three or more etch processes, for example. The patterning of the hard mask 108 and the upper portion 106b of the material layer 106 in accordance with embodiments of the present invention is not limited to only two patterns, as shown in the drawings. A plurality of first patterns and/or second patterns may be formed in the hard mask 108 and the upper portion 106b of the material layer 106, and then the plurality of patterns may be transferred to the lower portion 106a using an additional, final etch process.

As an example, two lithography masks may be used to pattern the hard mask 108 with the first pattern shown in FIGS. 4 and 5. Rather than using a single lithography mask, one lithography mask may comprise a pattern for first alternating features of the first pattern, e.g., the first lithography mask may comprise a pattern for every other feature. The mask may have a pattern for a portion of the first pattern, for example. A first etch process 114 shown in FIG. 4 may be used to pattern the hard mask 108 and the upper portion 106b with the pattern for first alternating features of the first pattern. Then, another anti-reflective coating 110a and another layer of photoresist 112a is deposited over the hard mask 108, and using another lithography mask comprising a pattern for second alternating features of the first pattern (e.g., which may be staggered over by one feature from the previous lithography mask), the hard mask 108 and the upper portion 106b of the material layer 106 are patterned with the pattern for the second alternating features of the first pattern. This mask may comprise another portion of the first pattern, for example.

Then, after the first pattern is formed in the hard mask 108 and the upper portion 106b of the material layer 106 using the two (or more) lithography masks, the second pattern is formed in the hard mask 108 and the upper portion 106b of the material layer 106, as shown and described with respect to FIGS. 7 through 9, also optionally using one or more lithography masks.

Advantageously, sub-resolution features (e.g., having a size or dimension less than the resolution limit of the lithography equipment or lithography system used to process the semiconductor device 100) may be patterned in the hard mask 108 and the material layer 106 by using two or more lithography masks to form the first pattern or the second pattern, for example, in accordance with embodiments of the present invention. Features may be formed that have a sub-resolution size in a first direction, in a second direction substantially orthogonal to the first direction, or both, for example.

Embodiments of the present invention described herein comprise novel manufacturing and patterning methods, and methods of processing semiconductor devices 100. Embodiments of the present invention also include semiconductor devices 100 and 130 patterned using the novel methods described herein, for example.

Novel methods of patterning features of a semiconductor device 100 have been described herein that utilize at least two lithography masks 101a and 101b, at least two masking material layers 110a/112a and 110b/112b, and at least three etch processes 114, 120, and 122. At least one lithography mask 101a shown in FIG. 1 preferably comprises at least a portion of a pattern in opaque material 105a for lengthwise portions of gate electrodes, for example, defining the width (dimension $d_3$) of gates formed in the material layer 106, but not the lengths. The patterns in the opaque material 105a of the first mask 101a may comprise patterns for a plurality of elongated transistor gates, for example. The other at least one lithography mask 101b shown in FIG. 2 may comprise a cutter mask that is adapted to define at least a portion of the lengths (dimension $d_5$) of the gates formed in the material layer 106, e.g., the ends of the gates in a lengthwise direction. The patterns in the opaque material 105b of the second mask 101b may comprise at least a portion of a pattern for defining the length and ends of the plurality of elongated transistor gates patterned by the first mask 101a, for example.

The at least one first lithography mask 101a may be used first to pattern the hard mask 108 and the upper portion 106b of the material layer 106 in some embodiments, followed by the patterning of the hard mask 108 and the upper portion 106b of the material layer 106 with the at least one second lithography mask 101b, as shown in FIGS. 3 through 11. In other embodiments, the at least one second lithography mask 101b may be used first to pattern the hard mask 108 and the upper portion 106b of the material layer 106, followed by the patterning of the hard mask 108 and the upper portion 106b of the material layer 106 with the at least one first lithography mask 101a, not shown in the figures.

Because the upper portion 106b of the material layer 106 is doped and the lower portion 106a is undoped in some embodiments, the third etch process 122 is made easier. The doped vs. undoped portions 106b and 106a may provide etch selectivity, providing an indication of when the undoped portion 106a of the material layer 106 has been reached, during the first and second etch processes 114 and 120, for example.

Again, because the third etch process 122 comprises a less aggressive etch process, punch-through is avoided in regions that may otherwise be exposed to an etch process twice (e.g., if the lower portion 106a were also etched using the first and second etch processes 114 and 120). Thus, punch-through through the gate dielectric material 104 or into the workpiece 102 or other material layers during the first and second etch processes 114 and 120 is avoided by the use of embodiments of the present invention.

The first etch process 114 and/or the second etch process 120 may be adapted to introduce a tapered profile to the hard mask 108 and the upper portion 106b of the material layer 106 in some embodiments. Or, one etch process 114 or 120 may be adapted to introduce a tapered profile and the other etch process 120 or 114 may not. For example, if the features formed in the material layer 106 comprise a plurality of gates, advantageously, the second etch process 120 may be adapted to form tapered features, reducing the tip-to-tip spacing between adjacent gates.

As an example, FIG. 9 illustrates in phantom an embodiment wherein the second etch process 120 comprises an etch process adapted to form a tapered profile to the underlying material layers 108 and 106b. The etch process 120 may comprise a polymerizing etch, e.g., using high F-C low oxygen gas system, for example. The sidewalls of the hard mask 108 and the upper portion 106b of the material 106 are downwardly outwardly tapered, as shown, being thinner at the top than at the bottom, as shown in phantom. The top of the hard mask 108 may comprise a dimension $d_5$ comprising substantially the same dimension as the photoresist 112b and the anti-reflective coating 110b, and the bottom of the upper portion 106b of the material layer 106 may comprise a dimension $d_6$, as shown, wherein dimension $d_6$ is slightly greater than dimension $d_5$. The dimension $d_6$ may be greater than dimension $d_5$ by about 20 nm or less, as an example, although the difference in dimensions $d_5$ and $d_6$ may comprise other values. FIG. 11 shows a perspective view of the hard mask 108 and upper portion 106b having tapered sidewalls after the second etch process 120, shown in phantom.

Once the tapered profile of the hard mask 108 and upper portion 106b of the material layer 106 is established, further etch processes will form a tapered profile in the underlying lower portion 106a of the material layer 106, due to the nature of etch processes and the material properties of the material layer 106. For example, the third etch process 112 shown in FIG. 11 results in the formation of downwardly, outwardly tapered sidewalls in the lower portion 106a of the material layer 106, as shown in a perspective view in FIG. 12 in phantom. The bottom of the lower portion 106a of the material layer 106 after the third etch process 122 comprises a dimension $d_7$, wherein dimension $d_7$ is greater than dimension $d_6$, for example. The dimension $d_7$ may be greater than dimension $d_6$ by about 20 nm or less, as an example, although the difference in dimensions $d_6$ and $d_7$ may comprise other values.

Dimension $d_7$ represents the distance between the ends of adjacent gates in a length-wise direction. Dimension $d_8$ represents the tip-to-tip spacing between the adjacent gate ends, e.g., at the bottom of the gates formed from the material layer 106a/106b. Advantageously, because the gate lengths are increased to dimension $d_7$ at the bottom, the tip-to-tip spacing (dimension $d_8$) between the gate ends is decreased. A top view of the decreased tip-to-tip spacing (dimension $d_8$) and the increased gate lengths (dimension $d_7$) according to this embodiment is shown in phantom in FIG. 13, for example.

In some applications, the second pattern is formed using a "cutter mask" adapted to cut or define the ends of the gates. The lithography processes used to define the ends of the gates may be challenging. It may be difficult to print very narrow features such as the spacing between gate ends, and bias cannot be added during the etch process to improve the printing. In accordance with embodiments of the present invention, if a tapered profile is introduced during the cutter mask pattern transfer, the etch process (e.g., the second etch process 120) is used to assist in the definition and printing of the gate ends, and sub-resolution tip-to-tip spacing can advantageously be achieved, exceeding the resolution limits of the lithography system. The tip-to-tip spacing may comprise a sub-resolution pattern having a smaller dimension than the resolution limit of the lithography system used to process the semiconductor device 100, for example.

Furthermore, in yet other embodiments, a tapered profile may be intentionally introduced during the third etch process 122 to pattern the lower portion 106a of the material layer 106, to reduce a tip-to-tip distance (e.g., between ends) of a lower portion of gates 106c, 106d, 106e, 106f, 106g, and 106h formed in the material layer 106. The tapered profile may be introduced during the third etch process 122 of the lower portion 106a of the material layer 106, for example. The length and width of gates 106c, 106d, 106e, 106f, 106g, and 106h formed in the material layer 106 may be narrower at the top in the upper portion 106b and narrower than in the hard mask 108, than at the bottom in the lower portion 106a proximate the workpiece 102 in these embodiments, so that the gate 106c, 106d, 106e, 106f, 106g, and 106h length and width at the bottom of the gates 106 is increased, for example, not shown in the drawings.

In other embodiments, because a less aggressive etch process at a low temperature is used for the third etch process 122, substantially vertical sidewalls advantageously may be formed in the lower portion 106a of the material layer 106, for example. Thus, semiconductor devices 100 with improved profile control may be achieved using embodiments of the present invention, for example.

Furthermore, because the first and second masking materials 110a/112a and 110b/112b are used to etch away only the hard mask 108 and the upper portion 106b of the material layer 106, these masking materials 110a/112a and 110b/112b may be made thinner. For example, photosensitive materials 112a and 112b comprising photoresist may be reduced in size because the entire thickness of the material layer 106 is not etched away using photosensitive materials 112a and 112b as a mask.

In addition, the use of a trilayer resist is also not required for the masking materials 110a/112a and 110b/112b, because the entire thickness of the material layer 106 is not etched away until the final, third etch process 122. However, alternatively, the first and second masking materials 110a/112a and 110b/112b may comprise trilayer resists in some embodiments, for example.

Another advantage of embodiments of the present invention is improving the integrity of the pattern transfer, forming crisp, clean features in the material layer 106. The first and second etch processes 114 and 120 are performed in a relatively small aspect ratio material, e.g., only in the upper portion 106b of the material layer 106 rather than the entire thickness of the material layer 106, which has a higher aspect ratio. The timing of the first and second etch processes 114 and 120 through the decreased thickness of the upper portion 106b, compared to the entire thickness of the material layer 106, is easier because of the decreased thickness of the portion of the material layer 106 etched. Furthermore, the timing of the third etch process 122 is also made easier because the etch process 122 is only required to etch away portions of the lower portion 106a of the material layer 106, for example. The improved timing control further facilitates the protection of the gate dielectric material 104 from harsh etch processes, and reduces the likelihood of punch-through or damage of the gate dielectric material 104, for example. The improved timing control provided by embodiments of the present invention also preserves the profile of features formed, e.g., of the gates formed in the material layer 106.

Patterning the upper portion 106b of the material layer 106 with the first pattern and the second pattern, and then using a separate etch process (the third etch process 122) to transfer the first and second patterns to the lower portion 106a of the material layer 106 in accordance with embodiments of the present invention also results in improved fidelity in the pattern transfer from the at least one first lithography mask and the at least one second lithography mask described herein, for example.

Embodiments of the present invention have been described herein for applications that utilize a positive photoresist, wherein the patterns transferred to the photoresists 112a and 112b and also the material layer 106 are the same patterns on the lithography masks 101a and 101b. Embodiments of the present invention may also be implemented in applications where negative photoresists 112a and 112b are used, e.g., wherein the patterns transferred to the photoresists 112a and 112b and the material layer 106 comprise a reverse image of the patterns on the lithography masks 101a and 101b.

Advantageously, because a hard mask 108 is used in the novel patterning methods described herein, a wide range of materials may be used for the material layer 106 to be patterned. For example, some conductors such as metals require a hard mask to pattern them, and such materials cannot be patterned using photoresist alone. Thus, in accordance with embodiments of the present invention, the material layer 106 may comprises a semiconductive material, a metal, or combinations thereof, allowing compatibility in semiconductor designs that require or would benefit from a metal as a gate material, for example.

The novel lithography methods and semiconductor device 100 manufacturing methods described herein may be used to fabricate many types of semiconductor devices 100, including memory devices and logic devices, as examples, although other types of semiconductor devices, integrated circuits, and circuitry may be fabricated using the novel embodiments of the present invention described herein. Embodiments of the present invention may be implemented in lithography systems using light at wavelengths of 248 nm or 193 nm, for example, although alternatively, other wavelengths of light may also be used. The lithography masks 101a and 101b described herein may comprise binary masks, phase-shifting masks, attenuating masks, dark field, bright field, transmissive, reflective, or other types of masks, as examples.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of processing a semiconductor device, the method comprising:
   providing a workpiece, the workpiece comprising a material layer to be patterned disposed thereon, the material layer comprising an upper portion and a lower portion disposed beneath the upper portion;
   forming a hard mask over the material layer;
   forming a first pattern in the hard mask and the upper portion of the material layer using a first etch process;
   forming a second pattern in the hard mask and the upper portion of the material layer using a second etch process, the second pattern being different than the first pattern; and
   forming the first pattern and the second pattern in the lower portion of the material layer using a third etch process and using the hard mask as a mask, wherein the first pattern defines a gate length for a plurality of transistor gates and the second pattern defines a width of the plurality of transistor gates.

2. The method according to claim 1, wherein the first etch process and the second etch process comprise more aggressive etch processes than the third etch process.

3. The method according to claim 1, wherein forming the first pattern and forming the second pattern in the upper and lower portions of the material layer comprise forming a first pattern and a second pattern that intersect.

4. The method according to claim 1, wherein forming the first pattern and forming the second pattern in the upper and lower portions of the material layer comprise forming a plurality of transistor gates.

5. The method according to claim 1, wherein forming the first pattern and forming the second pattern in the upper and lower portions of the material layer comprise forming a plurality of transistor gates of a static random access memory (SRAM) device.

6. The method according to claim 1, wherein forming the first pattern or forming the second pattern comprises using at least one lithography mask.

7. A method of patterning a material layer of a semiconductor device, the method comprising:
   providing a workpiece, the workpiece comprising a material layer to be patterned disposed thereon, the material layer comprising an upper portion and a lower portion disposed beneath the upper portion;
   forming a hard mask over the material layer;
   forming a first masking material over the hard mask;
   patterning the first masking material with a first pattern;
   transferring the first pattern of the first masking material to the hard mask and the upper portion of the material layer using a first etch process;
   removing the first masking material;
   forming a second masking material over the hard mask and the lower portion of the material layer;
   patterning the second masking material with a second pattern, the second pattern being different than the first pattern;
   transferring the second pattern of the second masking material to the hard mask and the upper portion of the material layer using a second etch process; and
   transferring the first pattern and the second pattern of the hard mask and the upper portion of the material layer to the lower portion of the material layer using a third etch process, wherein the first pattern defines a gate length for a plurality of transistor gates and the second pattern defines a width of the plurality of transistor gates.

8. The method according to claim 7, wherein the first etch process or the second etch process comprises a $CF_4$-based etch chemistry.

9. The method according to claim 7, wherein the third etch process comprises an HBr-based etch chemistry.

10. The method according to claim 7, wherein forming the first masking material or forming the second masking material comprises forming an anti-reflective coating and forming a photosensitive material over the anti-reflective coating.

11. The method according to claim 10, wherein forming the first masking material or the second masking material further comprises forming an optically dense layer (ODL), before forming the anti-reflective coating.

12. A method of manufacturing a semiconductor device, the method comprising:
   providing a workpiece;
   forming a material layer over the workpiece, the material layer comprising an upper portion and a lower portion disposed beneath the upper portion;
   forming a hard mask over the material layer;
   disposing a first photosensitive material over the hard mask;
   patterning the first photosensitive material using a first lithography mask, the first lithography mask comprising a first portion of a pattern;
   forming the first portion of the pattern in the hard mask and the upper portion of the material layer using the first photosensitive material as a mask and using a first etch process;
   removing the first photosensitive material;
   disposing a second photosensitive material over the patterned hard mask and exposed portions of the lower portion of the material layer;

patterning the second photosensitive material using a second lithography mask, the second lithography mask comprising a second portion of the pattern, the second portion of the pattern comprising a different pattern than the first portion of the pattern;

forming the second portion of the pattern in the hard mask and the upper portion of the material layer using the patterned second photosensitive material as a mask and using a second etch process;

removing the second photosensitive material; and forming the first portion of the pattern and the second portion of the pattern in the lower portion of the material layer using the hard mask as a mask and using a third etch process, wherein the first portion of the pattern defines a gate length for a plurality of transistor gates and the second portion of the pattern defines a width of the plurality of transistor gates.

13. The method according to claim 12, wherein the third etch process comprises a temperature of about 30 to 60 degrees C.

14. The method according to claim 12, wherein the third etch process comprises a lower temperature than the first etch process and/or the second etch process.

15. The method according to claim 12, wherein forming the hard mask comprises forming a nitride material layer, an oxide material layer, or combinations or multiple layers thereof.

16. The method according to claim 12, wherein the method is performed using a lithography system, the lithography system having a resolution limit, and wherein forming the first portion of the pattern or the second portion of the pattern in the lower portion of the material layer comprises forming a sub-resolution pattern in at least the lower portion of the material layer, the sub-resolution pattern comprising a smaller dimension than the resolution limit of the lithography system.

17. A method of manufacturing a semiconductor device, the method comprising:

providing a workpiece;

forming a material layer over the workpiece, the material layer comprising an upper portion and a lower portion disposed beneath the upper portion;

forming a hard mask over the material layer;

disposing at least one first photosensitive material over the hard mask;

exposing the at least one first photosensitive material using at least one first lithography mask, the at least one first lithography mask comprising at least a portion of a first portion of a pattern;

developing the at least one first photosensitive material, forming at least the portion of the first portion of the pattern in the at least one first photosensitive material;

using the at least one first photosensitive material as a mask to form the at least the portion of the first portion of the pattern in the hard mask and at least a portion of the upper portion of the material layer;

removing the at least one first photosensitive material;

disposing at least one second photosensitive material over the patterned hard mask and exposed portions of the lower portion of the material layer;

exposing the at least one second photosensitive material using a second lithography mask, the second lithography mask comprising at least a portion of a second portion of the pattern, the at least the portion of the second portion of the pattern comprising a different pattern than the at least the portion of the first portion of the pattern and intersecting in regions with the at least the portion of the first portion of the pattern;

developing the at least one second photosensitive material, forming the at least the portion of the second portion of the pattern in the at least one second photosensitive material;

using the patterned at least one second photosensitive material as a mask to form the at least the portion of the second portion of the pattern in the hard mask and the at least a portion of the upper portion of the material layer;

removing the at least one second photosensitive material; and using the hard mask as a mask to form the at least the portion of the first portion of the pattern and the at least the portion of the second portion of the pattern in the lower portion of the material layer, wherein exposing the at least one first photosensitive material using the at least one first lithography mask comprises using a first lithography mask wherein the first portion of the pattern comprises a pattern for a plurality of elongated transistor gates and wherein exposing the at least one second photosensitive material using the at least one second lithography mask comprises using a second lithography mask wherein the second portion of the pattern comprises a pattern for defining length and ends of the plurality of elongated transistor gates patterned by the first lithography mask; or wherein exposing the at least one first photosensitive material using the at least one first lithography mask comprises using a first lithography mask wherein the first portion of the pattern comprises a pattern for defining lengths and ends of a plurality transistor gates and wherein exposing the at least one second photosensitive material using the at least one second lithography mask comprises using a second lithography mask wherein the second portion of the pattern comprises a pattern for widths of the plurality of transistor gates patterned by the first lithography mask.

18. The method according to claim 17, wherein the ends of the plurality of transistor gates defined by the first lithography mask or the second lithography mask comprise substantially flat edges.

19. The method according to claim 17, wherein forming the material layer comprises forming a conductive material, a metal, a semiconductive material, an insulator, or multiple layers or combinations thereof.

20. The method according to claim 17, wherein forming the material layer comprises introducing a dopant material into the upper portion of the material layer.

21. The method according to claim 17, further comprising forming a tapered profile to the lower portion of the material layer when using the hard mask as a mask to form the at least the portion of the first portion of the pattern and the at least the portion of the second portion of the pattern in the lower portion of the material layer, wherein the lower portion of the material layer comprises a slightly greater width or length of features than in the upper portion of the material layer and the hard mask.

22. The method according to claim 17, further comprising forming a tapered profile to the hard mask and the at least the portion of the upper portion of the material layer, when using the at least one first photosensitive material as a mask to form the at least the portion of the first portion of the pattern in the hard mask and at least a portion of the upper portion of the material layer, or when using the patterned at least one second photosensitive material as a mask to form the at least the portion of the second portion of the pattern in the hard mask and the at least a portion of the upper portion of the material layer.

23. A method of manufacturing a static random access memory (SRAM) device, the method comprising:
providing a workpiece;
forming a plurality of isolation regions in the workpiece;
forming a plurality of active areas in the workpiece between the plurality of isolation regions;
forming a gate dielectric material over the workpiece;
forming a gate material over the workpiece, the gate material comprising an upper portion and a lower portion disposed beneath the upper portion;
forming a hard mask over the gate material;
disposing a first photosensitive material over the hard mask;
patterning the first photosensitive material using a first lithography mask, the first lithography mask comprising a first portion of a pattern;
forming the first portion of the pattern in the hard mask and at least a portion of the upper portion of the gate material using the first photosensitive material as a mask and using a first etch process;
removing the first photosensitive material;
disposing a second photosensitive material over the patterned hard mask and exposed portions of the lower portion of the gate material;
patterning the second photosensitive material using a second lithography mask, the second lithography mask comprising a second portion of the pattern, the second portion of the pattern comprising a different pattern than the first portion of the pattern;
forming the second portion of the pattern in the hard mask and at least a portion of the upper portion of the gate material using the patterned second photosensitive material as a mask and using a second etch process;
removing the second photosensitive material; and
forming the first portion of the pattern and the second portion of the pattern in the lower portion of the gate material using the hard mask as a mask and using a third etch process, forming a plurality of gates in the gate material, wherein the first portion of the pattern defines a gate length for the plurality of gates and the second portion of the pattern defines a width of the plurality of gates.

24. The method according to claim 23, wherein forming the gate material comprises forming a gate material wherein the upper portion of the gate material comprises doped polysilicon and wherein the lower portion of the gate material comprises undoped polysilicon.

25. The method according to claim 23, wherein forming the first portion and the second portion of the pattern in the at least the portion of the upper portion of the gate material comprises forming the first portion and the second portion of the pattern in an upper about 30 to 70% of the upper portion of the gate material.

26. The method according to claim 23, wherein forming the first portion and the second portion of the pattern in the at least the portion of the upper portion of the gate material comprises forming the first portion and the second portion of the pattern in an entire thickness of the upper portion of the gate material.

27. The method according to claim 23, wherein the first etch process and/or the second etch process comprise a two-step etch process comprising a first end-point-detecting etch process for etching the hard mask and a second timed etch for etching the at least the portion of the upper portion of the gate material.

* * * * *